(12) United States Patent
Bhattacharyya

(10) Patent No.: US 8,288,264 B2
(45) Date of Patent: Oct. 16, 2012

(54) SCALABLE MULTI-FUNCTION AND MULTI-LEVEL NANO-CRYSTAL NON-VOLATILE MEMORY DEVICE

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 31 days.

(21) Appl. No.: 13/027,573

(22) Filed: Feb. 15, 2011

(65) Prior Publication Data

US 2011/0134691 A1 Jun. 9, 2011

Related U.S. Application Data

(60) Division of application No. 12/338,413, filed on Dec. 18, 2008, now Pat. No. 7,898,022, which is a continuation of application No. 11/210,363, filed on Aug. 24, 2005, now Pat. No. 7,476,927.

(51) Int. Cl.
*H01L 21/336* (2006.01)
*G11C 11/34* (2006.01)
*B82Y 40/00* (2011.01)

(52) U.S. Cl. .. 438/591; 365/184; 977/943; 257/E21.423

(58) Field of Classification Search ................... 438/591; 365/184; 977/943; 257/E21.423
See application file for complete search history.

(56) References Cited

U.S. PATENT DOCUMENTS

| | | | |
|---|---|---|---|
| 4,870,470 A | 9/1989 | Bass, Jr. et al. | |
| 6,855,979 B2 | 2/2005 | Sadd et al. | |
| 6,885,060 B2 | 4/2005 | Nomoto et al. | |
| 6,887,758 B2 | 5/2005 | Chindalore et al. | |
| 6,888,200 B2 | 5/2005 | Bhattacharyya | |
| 2004/0155299 A1* | 8/2004 | Bhattacharyya | 257/378 |
| 2004/0245577 A1* | 12/2004 | Bhattacharyya | 257/369 |
| 2007/0026621 A1* | 2/2007 | Cho et al. | 438/314 |

OTHER PUBLICATIONS

C. Gerardi et al., Fast and Low Voltage Program / Erase in Nanocrystal Memories: Impact of Control Dielectric Optimization, Non Volatile Semiconductor Memory Workshop 2004, pp. 71, 2004.
C.M. Compagnoni et al., Study of Data Retention for Nanocrystal Flash Memories, IEEE 41$^{st}$ Annual Intl. Reliability Physics Symposium, Dallas, Texas, 2003, pp. 506-512.
R. Ohba et al., Impact of Stoichiometry Control in Double Junction Memory on Future Sealing, IEDM, 2004, pp. 897-900.
C. Monzio Compagnoni et al., Program/Erase Dynamics and Channel Conduction in Nanocrystal Memories, IEDM, 2003, pp. 550-553.

(Continued)

*Primary Examiner* — David S Blum
(74) *Attorney, Agent, or Firm* — Leffert Jay & Polglaze, P.A.

(57) ABSTRACT

A multi-functional and multi-level memory cell comprises a tunnel layer formed over a substrate. In one embodiment, the tunnel layer comprises two layers such as $HfO_2$ and $LaAlO_3$. A charge blocking layer is formed over the tunnel layer. In one embodiment, this layer is formed from HfSiON. A control gate is formed over the charge blocking layer. A discrete trapping layer is embedded in either the tunnel layer or the charge blocking layer, depending on the desired level of non-volatility. The closer the discrete trapping layer is formed to the substrate/insulator interface, the lower the non-volatility of the device. The discrete trapping layer is formed from nano-crystals having a uniform size and distribution.

14 Claims, 7 Drawing Sheets

OTHER PUBLICATIONS

Y.Q. Wang et al., Formation of Ge Nanocrystals in HfAlO High-k Dielectric and Application in Memory Device, vol. 84, No. 26, Jun. 2004, pp. 5407-5409.

D. Zhao et al., Simulation of Hetero-nanocrystal Floating Gate Flash Memory, IEDM, 2004.

R. Gupta et al., Formation of SiGe Nanocrystals in $Hf0_2$ Using *In-Situ* Chemical Vapor Deposition for Memory Application, Applied Physics Letters, vol. 84, No. 21, May 2004, pp. 4331-4333.

S. Lombardo et al., Distribution of the Threshold Voltage Window in Nanocrystal Memories with Si Dots Formed by Chemical Vapor Deposition: Effect of Partial Self-Ordering, NVSMW, 2004, pp. 69-70.

M. Kanoun et al., Electrical Study of Ge-Nanocrystal-Based Metal-Oxide-Semiconductor Structures for P-Type Nonvolatile Memory Applications, Applied Physics Letters, vol. 84, No. 25, Jun. 2004, pp. 5079-5081.

M. Koyanagi et al., Metal Nano-Dot Memory for High Density Non-Volatile Memory Application, IEEE SNVMW, 2004, pp. 0-7803-8511-X/04.

P. Dimitrakis et al., Silicon Nanocrystal Memory Devices Obtained by Ultra-Law-Energy Ion-Beam Synthesis, International Solid State Electronics, 48, 2004, pp. 1511-1517.

\* cited by examiner

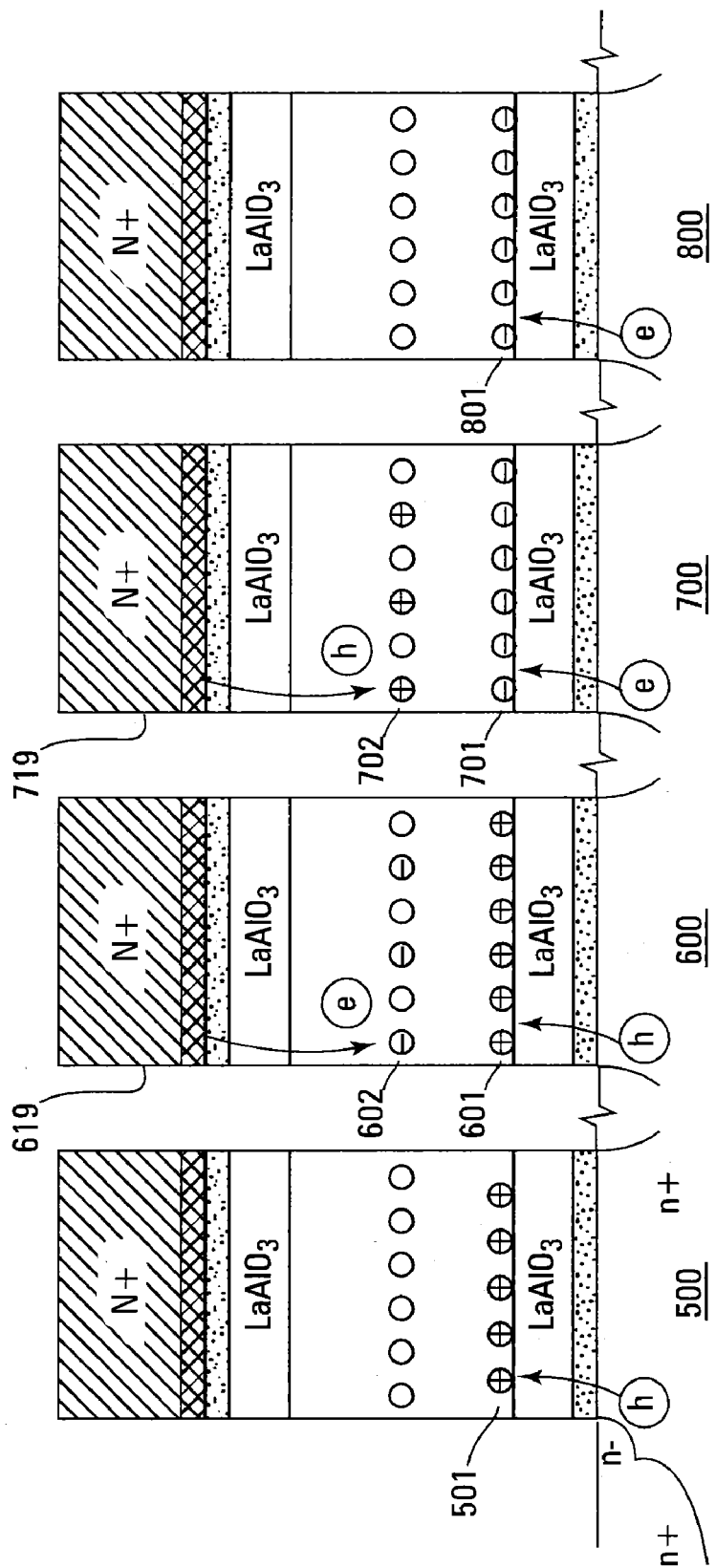

SCALABLE MULTI-FUNCTION AND MULTI-LEVEL NANO-CRYSTAL NON-VOLATILE MEMORY DEVICE

RELATED APPLICATIONS

This is a divisional application of U.S. patent application Ser. No. 12/338,413, now U.S. Pat. No. 7,898,022 filed Dec. 18, 2008, titled "SCALABLE MULTI-FUNCTIONAL AND MULTI-LEVEL NANO-CRYSTAL NON-VOLATILE MEMORY DEVICE" that is a continuation application of 11/210,363, now U.S. Pat. No. 7,476,927, filed Aug. 24, 2005, titled "SCALABLE MULTI-FUNCTIONAL AND MULTI-LEVEL NANO-CRYSTAL NON-VOLATILE MEMORY DEVICE" which is commonly assigned, the entire contents of which are incorporated herein by reference.

TECHNICAL FIELD

The present invention relates generally to memory devices and in particular the present invention relates to DRAM and non-volatile memory devices.

BACKGROUND

Memory devices are typically provided as internal, semiconductor, integrated circuits in computers or other electronic devices. There are many different types of memory including random-access memory (RAM), read only memory (ROM), non-volatile, floating gate NOR/NAND flash memory, and dynamic random access memory (DRAM).

Flash memories may use floating gate technology or trapping technology in order to store data in the form of charges. Floating gate cells include source and drain regions that are laterally spaced apart to form an intermediate channel region. The source and drain regions are formed in a common horizontal plane of a silicon substrate. The floating gate, typically made of doped polysilicon, is disposed over the channel region and is electrically isolated from the other cell elements by oxide. The non-volatile memory function for the floating gate technology is created by the absence or presence of charge stored on the isolated floating gate.

The trapping technology functions as a non-volatile memory and can be implemented in a silicon-oxide-nitride-oxide-silicon (SONOS) architecture or nano-crystal devices. The nitride trap or nano-crystal layer can capture and store electrons or holes that have tunneled through the tunnel insulator in order to act as a non-volatile memory. These types of devices are typically referred to as discrete trap or embedded trap devices.

Conventional DRAM cells comprise a switching transistor and an integrated storage capacitor tied to the storage node of the transistor. Charge storage is enhanced by providing appropriate storage capacity in the form of a stacked capacitor or a trench capacitor in parallel with the depletion capacitance of the floating storage node. DRAM cells are volatile and therefore lose data when the power is removed.

DRAMs use one or more arrays of memory cells arranged in rows and columns. Each of the rows of memory cells is activated by a corresponding row line that is selected from a row address. A pair of complementary digit lines are provided for each column of the array and a sense amplifier coupled to the digit lines for each column is enabled responsive to a respective column address. The sense amplifier senses a small voltage differential between the digit lines and amplifies such voltage differential.

Due to finite charge leakage across the depletion layer, the capacitor has to be recharged frequently to ensure data integrity. This is referred to in the art as refreshing and can be accomplished by periodically coupling the memory cells in the row to one of the digit lines after enabling the sense amplifiers. The sense amplifiers then restore the voltage level on the memory cell capacitor to a voltage level corresponding to the stored data bit. The permissible time between refresh cycles without losing data depends on various factors, such as rate of charge dissipation in the memory capacitor, but is typically in the range of milliseconds.

Computers, cell phones, and many other hand-held electronic devices employ several types of the above memories for working memory and data store. These memories require custom technologies that are typically not compatible to each other due to different cell design, fabrication techniques, and material characteristics. Consequently, the different memories are produced on different silicon substrates to minimize cost and maximize product yield.

Both DRAM and floating gate flash consume relatively high power compared to other memory technologies. DRAM requires frequent refreshing to maintain the data integrity while flash memory requires on-chip high voltage/current for programming and erase operations.

Another problem with these technologies is scalability. The DRAM has capacitor scalability problems while the flash has voltage and coupling noise scalability problems. Additionally, with progressive scaling of feature size, fundamental device leakage issues such as short-channel effects and gate dielectric leakage will need to be contained in order to take advantage of scaling.

To solve some of these problems, single transistor SONOS/nano-crystal devices have been used. However, these types of devices can exhibit limited retention and small values for the memory window, thus limiting their application potential and scalability for non-volatile memory. This is due to the fact that nitride layers provide relatively shallow trap depth and nano-crystals provide low trap density due to coulomb blocade and quantum confinement effects. The threshold window of memory devices using nano-crystals is also adversely affected by the separation of the nano-crystals if the relative distances between the nano-crystals are random.

For the reasons stated above, and for other reasons stated below that will become apparent to those skilled in the art upon reading and understanding the present specification, there is a need in the art for a discrete trap, multi-functional memory device that incorporates nano-crystals having uniform distribution and size with a high density.

BRIEF DESCRIPTION OF THE DRAWINGS

FIG. 5 shows one embodiment of a programming scheme of the present invention in accordance with the dual bit memory cell of FIG. 4.

FIG. 6 shows another embodiment of the programming scheme of the present invention in accordance with the dual bit memory cell of FIG. 4.

FIG. 7 shows another embodiment of the programming scheme of the present invention in accordance with the dual bit memory cell of FIG. 4.

FIG. 8 shows another embodiment of the programming scheme of the present invention in accordance with the dual bit memory cell of FIG. 4.

DETAILED DESCRIPTION

Figure 1:
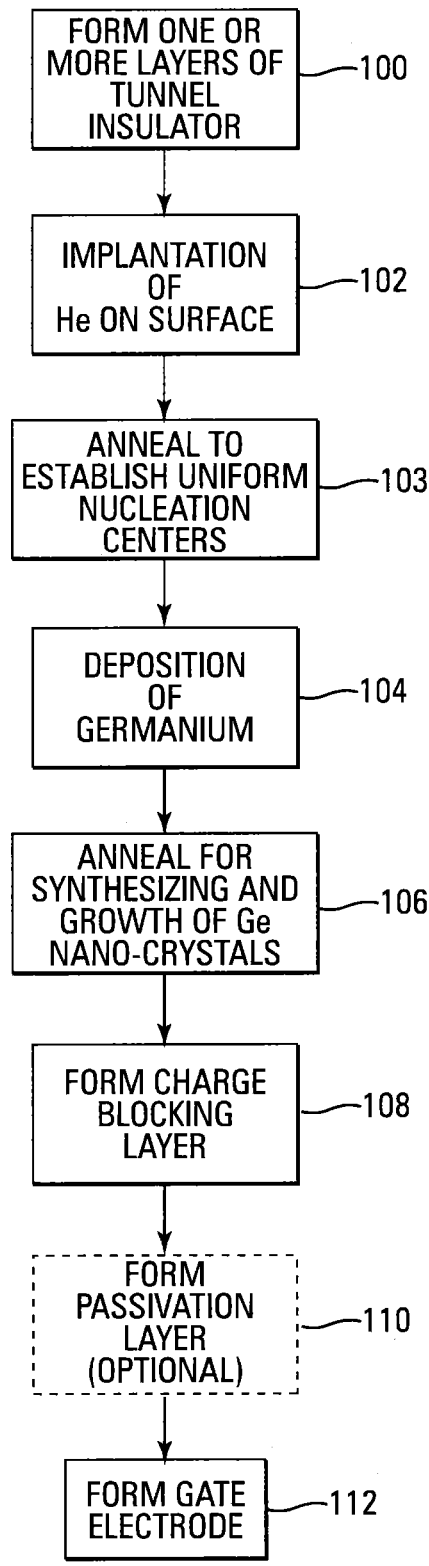
FIG. 1 shows a flowchart of one embodiment of a method for fabrication of a nano-crystal memory cell of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

The fabrication embodiments of the present invention provide enhanced scalability characteristics and substantially eliminate the adverse effects of quantum confinement and coulomb blocade. These characteristics directly affect charge trap behavior as well as the number of charged particles that can be part of a nano-crystal.

Quantum confinement, as is well known in the art, describes how the electronic properties—the organization of energy levels into which electrons can climb or fall—change when a nano-particle is sufficiently small in size. This size is typically 10 nanometers (nm) or less. Specifically, the phenomenon results from electrons and holes being squeezed into a dimension that approaches a critical quantum measurement, called the "exciton Bohr radius." The larger the particle size, the lower the ground state and, therefore, the longer the charge can be retained. The smaller the particle size, the more easily the electron stays in a shallow energy level so that it can come out more readily.

Coulomb blocade, as is well known in the art, is the suppression of current, at low bias, due to the discreteness of an elementary charge and is typically observed at the nanoscale in nano-particles. A nano-crystal becomes a charge center when it attracts a charge. A nano-crystal can capture multiple electrons. Every time an electron is captured, the electrostatic field around the nano-crystal builds up to the point where it repels other electrons. At this point, any more incoming electrons come in at a higher energy state that allows them to leak out. Therefore, the more electrons that are captured, the lower the charge retention time.

Scalability in devices that are influenced by these characteristics is limited by memory window/retention trade-offs. The embodiments of the fabrication methods of the present invention provide nano-crystal density in the range of $2 \times 10^{12}/cm^2$ to $10^{13}/cm^2$, nano-crystal diameters in the range of 3-4 nm (to reduce/optimize quantum confinement) with controllability in the range of ±25%, and precise control of spacing of the nano-crystals to reduce fluctuations of device threshold windows from bit to bit. Additionally these techniques provide precise control of placement of the planar layer of nano-crystals with reference to the tunneling distance of the device. This is accomplished by controlling the atomic flux of the nano-material incident on a desired planar location of the gate insulator interface that is pretreated to provide controlled nucleation centers and, thus, self-ordered nucleation of nano-crystals.

The fabrication embodiments of the present invention discuss the incorporation of germanium (Ge) nano-crystals or Ge/Si nano-crystals into the device gate insulator. However, alternate embodiments of the present invention can be used with other nano-crystals.

Precise control of atomic flux of germanium nano-crystals at the desired interface can be achieved by ion-beam implantation of germanium of appropriate fluence (e.g., $2 \times 10^{15}/cm^2$ to $5 \times 10^{16}/cm^2$) using ultra low energy implanter (energy range of 0.1 to 2.0 keV) to a pretreated surface containing a controlled nucleation center. Another way to control the atomic flux of germanium nano-crystals is an appropriate atomic layer deposition (ALD) technique of depositing germanium by a single atomic layer at a time over the pretreated surface. This is followed by a rapid thermal anneal (RTA) for synthesizing each deposited layer.

The controlled nucleation centers were created prior to germanium nano-crystal incorporation by ion beam implantation of helium (He) ion of appropriate fluence (e.g., $10^{13}/cm^2$ to $10^{15}/cm^2$) followed by a rapid thermal anneal. The He-associated nucleation centers thus formed preferentially nucleates germanium nano-crystals and aids in forming self-ordered growth of germanium nano-crystals. The helium implantation can also be carried out by using an ultra-low energy implanter.

In order to achieve Ge/Si nano-crystals, helium nucleation center formation is followed by silicon implantation prior to germanium incorporation in a similar manner as stated above, whereby germanium nano-crystals are formed preferentially on the silicon pre-nucleation centers thus formed. An alternate embodiment can incorporate a planar layer of injector silicon rich nitride as a nucleation seed layer before incorporating the germanium nano-crystals. This approach follows similar principles as stated above and will not be further discussed.

FIG. 1 illustrates one embodiment for a memory cell fabrication technique of the present invention. The method forms one or more layers of a thin tunnel insulator over a substrate surface 100. This layer controls silicon insulator barrier energy and tunnel distance.

In one embodiment, the substrate is a silicon substrate. Other embodiments can use other substrate materials.

Ion implantation of helium is performed 102 on the top surface and appropriate RTA 103 to establish uniform and ordered nucleation centers of the desired density. The deposition of germanium is then performed 104 by ion implantation or ALD of the well defined atomic concentration. Alternate embodiments may use other methods of germanium deposition.

RTA for synthesizing and growth of the germanium nano-crystals is performed 106 over the nucleation center of precise diameter and separation distance, thus achieving the targeted germanium nano-crystal density. This step also removes the helium from the surface.

An additional layer of an insulator over-layer is formed 108 under controlled environmental conditions to act as a charge blocking layer. An optional passivation layer is formed 110 over the charge blocking layer. The passivation layer controls back injection from a gate electrode.

The gate electrode is formed 112 over either the charge blocking layer or the passivation layer, if present. The gate can be n+ or p+ doped polysilicon. In an alternate embodiment, the gate is a metal such as tungsten.

Figure 2:
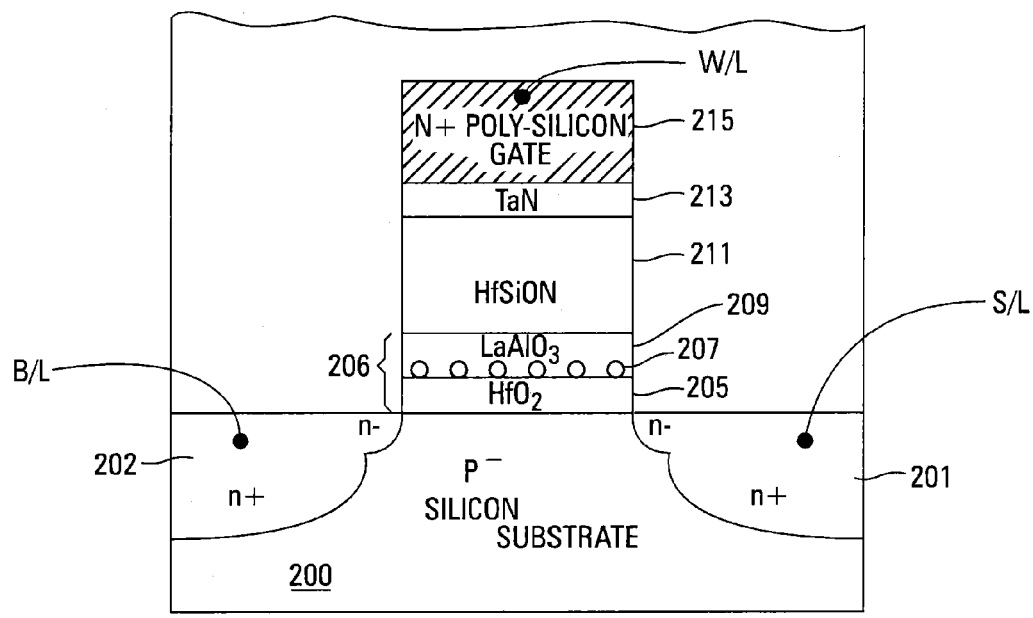
FIG. 2 shows a schematic cross-sectional view of one embodiment of a DRAM-functionality memory cell of the present invention.

FIG. 2 illustrates a schematic cross-sectional view of one embodiment of a DRAM-functionality memory cell of the present invention. This embodiment can be produced by the embodiments of the fabrication method of the present invention as discussed previously.

The memory cell comprises a substrate 200. In one embodiment, the substrate is a p– doped silicon. Alternate embodiments may use an n+ silicon or some other type of substrate material.

A pair of implanted regions 201, 202 are formed in the substrate 200. These regions are the drain 202 and source 201 regions for the memory cell. If the substrate 200 is a p– conductivity, the implanted regions 201, 202 are n+ doped regions. In one embodiment, the drain 202 and source 201 regions have an n– doping nearest the insulator stack. The drain region 202 is coupled to a bit line B/L that connects each of the memory cells in a column of a memory array. The source region 201 is coupled to a common source line S/L for the memory array. The cell may be connected in the memory array in a NAND architecture, a NOR architecture, or some other type of memory array architecture.

The gate insulator stack, in one embodiment, comprises a bi-layer tunnel dielectric 206 that is made up of a layer of $HfO_2$ (K=24) 205 that is formed over the substrate 200. This layer 205 has a thickness in the range of 2 to 4 nm. Alternate embodiments can have different thicknesses.

A layer of $LaAlO_3$ 209 (K=27.5) is formed over the first tunnel dielectric 206. The second tunnel dielectric 209 is formed in the range of 2 to 5 nm. Alternate embodiments can have different thicknesses.

A charge blocking layer 211 of HfSiON (K=17) is formed over the tunnel dielectric 206. The charge blocking layer 211 is formed to a thickness in the range of 6-20 nm. An optional passivation layer 213 of TaN is formed over the charge blocking layer 211. The gate electrode 215 is then formed over the charge blocking layer 211 or the passivation layer 213 if one is present. The gate is coupled to a word line W/L that connects a row of memory cells in the memory array. In one embodiment, the gate electrode is an n+ doped polysilicon.

The nano-crystal charge trap layer 207 is embedded at the $HfO_2/LaAlO_3$ interface for the DRAM functionality. This layer of nano-crystals 207, in one embodiment, is a germanium nano-crystal layer. Alternate embodiments may use other types of nano-crystals.

Figure 3:
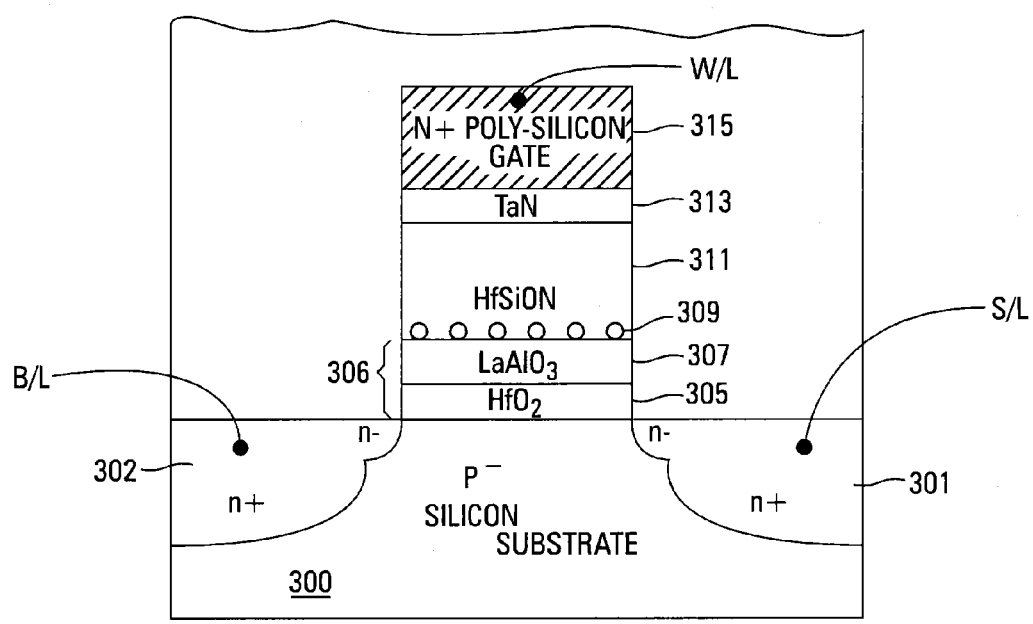
FIG. 3 shows a schematic cross-sectional view of one embodiment of a non-volatile-functionality memory cell of the present invention.

FIG. 3 illustrates a cross-sectional view of one embodiment of a non-volatile-functionality memory cell of the present invention. This embodiment is produced by the embodiments of the fabrication method of the present invention as discussed previously.

The memory cell comprises a substrate 300. In one embodiment, the substrate is a p– doped silicon. Alternate embodiments may use an n+ silicon or some other type of substrate material.

A pair of implanted regions 301, 302 are formed in the substrate 300. These regions are the drain 302 and source 301 regions for the memory cell. If the substrate 300 is a p– conductivity, the implanted regions 301, 302 are n+ doped regions. In one embodiment, the drain 302 and source 201 regions have an n– doping nearest the insulator stack. The drain region 302 is coupled to a bit line B/L that connects each of the memory cells in a column of a memory array. The source region 301 is coupled to a common source line S/L for the memory array. The cell may be connected in the memory array in a NAND architecture, a NOR architecture, or some other type of memory array architecture.

The gate insulator stack, in one embodiment, comprises a bi-layer tunnel dielectric 306 that is made up of a layer of $HfO_2$ (K=24) 305 that is formed over the substrate 300. This layer 305 has a thickness in the range of 2 to 4 nm. Alternate embodiments can have different thicknesses.

A layer of $LaAlO_3$ 307 (K=27.5) is formed over the first tunnel dielectric 305. The second tunnel dielectric 307 is formed in the range of 2 to 5 nm. Alternate embodiments can have different thicknesses.

A charge blocking layer 311 of HfSiON (K=17) is formed over the tunnel dielectric 306. The charge blocking layer 311 is formed to a thickness in the range of 6-20 nm. An optional passivation layer 313 of TaN is formed over the charge blocking layer 311. The gate electrode 315 is then formed over the charge blocking layer 311 or the passivation layer 313 if one is present. The gate is coupled to a word line W/L that connects a row of memory cells in the memory array. In one embodiment, the gate electrode is an n+ doped polysilicon.

The nano-crystal charge trap layer 309 is embedded at the $LaAlO_3/HfSiON$ interface for the non-volatile memory functionality. This layer of nano-crystals 309, in one embodiment, is a germanium nano-crystal layer. Alternate embodiments may use other types of nano-crystals.

The illustrated embodiments of FIGS. 1 and 2 both have, in one embodiment, an effective oxide thickness (EOT) that is less than or equal to 3 nm. These embodiments could be programmed (write/erase) at less than ±3V for both the DRAM and non-volatile memory functionality. The end of life (EOL) memory window is much greater than 1V for non-volatile memory and the refresh frequency for the DRAM functionality device would be greater than $10^3$ seconds.

In alternate embodiments of the memory devices of FIGS. 1 and 2, the gate insulator stack can be comprised of a graded composition of SiC—GeC—SiC for the tunnel insulator layer. In such an embodiment, the barrier height changes with the increase in the ratio of GeC to SiC. Therefore, the degree of non-volatility is increased as the ratio of GeC to SiC increases. A charge blocking layer of GeC, for a normal mode transistor, or SiOC, for a reverse mode transistor, can be used as the charge blocking layer. Germanium nano-crystals can then be embedded in such devices at the interface of the tunnel layer and the charge blocking layer.

Figure 4:
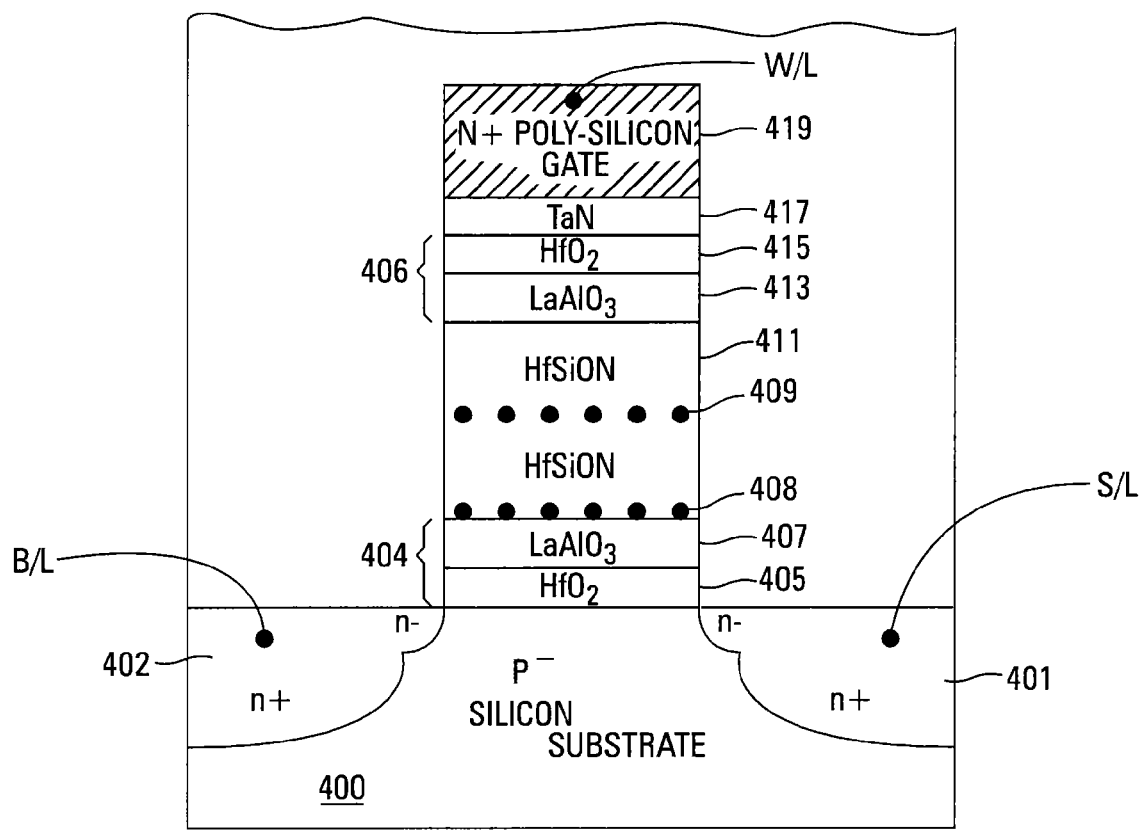
FIG. 4 shows a schematic cross-sectional view of one embodiment of a dual bit memory cell of the present invention.

FIG. 4 illustrates a schematic cross-sectional view of one embodiment of a dual bit memory cell of the present invention. The multi-level bit storage per device is achieved by incorporating two or more planar layers of Ge nano-crystals at appropriate distances from the injecting electrodes (i.e., substrate for normal mode/control gate for reverse mode). Such a device is uniquely programmed (write/erase) to establish multiple levels of stable high states to create well defined logic levels of charge storage.

The multi-level embodiment of FIG. 4 comprises a substrate 400 that, in one embodiment, is a p– doped silicon substrate. Alternate embodiments can use other materials and other types of conductivity doping.

Drain 402 and source 401 regions are implanted in the substrate 400. In the illustrated embodiment, these active regions are n+ doped regions with n– doping closer to the insulator stack. However, alternate embodiments can use other types of doping. The drain region 402 is coupled to the bit line for a particular column in a memory array and the source line is coupled to the common source line for the memory array. The cell may be connected in the memory array in a NAND architecture, a NOR architecture, or some other type of memory array architecture.

A first bi-layer tunneling insulator 404 comprises a 3 nm layer of $HfO_2$ 405 plus a 5 nm layer of $LaAlO_3$ 407. This insulator layer 404 interfaces the substrate and the device gate stack. Alternate embodiments may use other materials and thicknesses for these layers.

A 15 nm thick HfSiON charge blocking dielectric layer 411 is formed over the first tunneling insulator layer 404. Alternate embodiments can use other materials and thicknesses.

A second bi-layer tunneling insulator 406 is formed over the charge blocking layer 411. As in the first tunneling insulator 404, the second tunneling insulator comprises a 3 nm layer of $HfO_2$ 415 and a 5 nm layer of $LaAlO_3$ 413. This insulator layer interfaces the control gate 419 and the gate stack.

The charge blocking layer 411 comprises two embedded germanium nano-crystal layers 408, 409 that, in one embodiment are embedded respectively at the interface of the first tunnel layer 404 and the charge blocking layer 411 and also in the center of the charge blocking layer 411. For purposes of illustration, these layers are 8 nm and 15.5 nm, respectively, from the substrate/insulator interface.

An optional TaN passivation layer 417 is formed over the second tunneling insulator layer 406. The polysilicon control gate 419 is formed over either the second tunneling insulator 406 or the passivation layer 417, if one is present. The illustrated embodiment uses an n+ doped polysilicon for the control gate 419. However, depending on the transistor, alternate embodiments can use other types of doping. The control gate 419 is coupled to the word line of its respective row of the memory array. In an alternate embodiment, the gate is a metal such as tungsten.

FIGS. 5-8 illustrate a one embodiment of a programming scheme to create four levels of threshold that comprises $\pm V_p$ at two different pulse widths. The programming method of FIGS. 5-8 is for purposes of illustration only. Other methods that involve different levels of $\pm V_p$ and/or different pulse widths may be used to achieve substantially similar objectives. Additionally, the embodiments of the present invention are not limited to only two bits per cell. Alternate embodiments may store three or more bits per cell with refined programming combinations and improved sensing algorithms.

The method of FIG. 5-8 results in four well defined threshold states for a corresponding two bits of storage per cell. These states are defined as logical 00, 01, 10, and 11. As one example, the device thresholds for the memory cell of FIG. 4 corresponding to the memory states of 00, 01, 10, 11 could correspond respectively to $V_t=-4V, V_t=-1.5V, V_t=+1.5V$, and $V_t=+4V$. These threshold voltages are achieved at respective programming voltages of $-6V/t_1, -6V/t_2, +6V/t_2,$ and $+6V/t_1$ where $t_1$ and $t_2$ are two different pulse widths such that $t_1 \gg t_2$. For the device of FIG. 4, $t_2$ is on the order of microseconds while $t_1$ is in milliseconds. Alternate embodiments could have different time ranges for these values.

The memory states could be read at near 0V as well as approximately +5V. The states can be sensed for the differential conductance of the device to discriminate the memory states.

When the gate of the device of FIG. 4 is biased at $+V_p$, electrons are trapped at the bottom Ge nano-crystal layer while holes are trapped at the top Ge nano-crystal layer. When the gate is biased at $-V_p$, the electrons are trapped at the top Ge nano-crystal layer while the holes are trapped at the bottom Ge nano-crystal layer.

FIG. 5 illustrates the memory cell of FIG. 4 when programmed at a logical 00 state after a programming pulse of −6V at a width of $t_1$ is applied to the control gate. In this state, the threshold voltage $V_t=-4V$. This figure shows that the holes are injected from the substrate 500 to the lower trap layer 501.

FIG. 6 illustrates the memory cell of FIG. 4 when programmed at a logical 01 state after a programming pulse of −6V at a width of $t_2$ is applied to the control gate. In this state, the threshold voltage is $V_t=-1.5V$. This figure shows that the holes are injected from the substrate 600 to the lower trap layer 601 and the electrons are injected from the gate 619 to the upper trap layer 602.

FIG. 7 illustrates the memory cell of FIG. 4 when programmed at a logical 10 state after a programming pulse of +6V at a width of $t_2$ is applied to the control gate. In this state, the threshold voltage is $V_t=+1.5V$. This figure shows that the electrons are injected from the substrate 700 to the lower trap layer 701 and the holes are injected from the gate 719 to the upper trap layer 702.

FIG. 8 illustrates the memory cell of FIG. 4 when programmed at a logical 11 state after a programming pulse of +6V at a width of $t_1$ is applied to the control gate. In this state, the threshold voltage is +4V. This figure shows that the electrons are injected from the substrate 800 to the lower trap layer 801.

Figure 9:
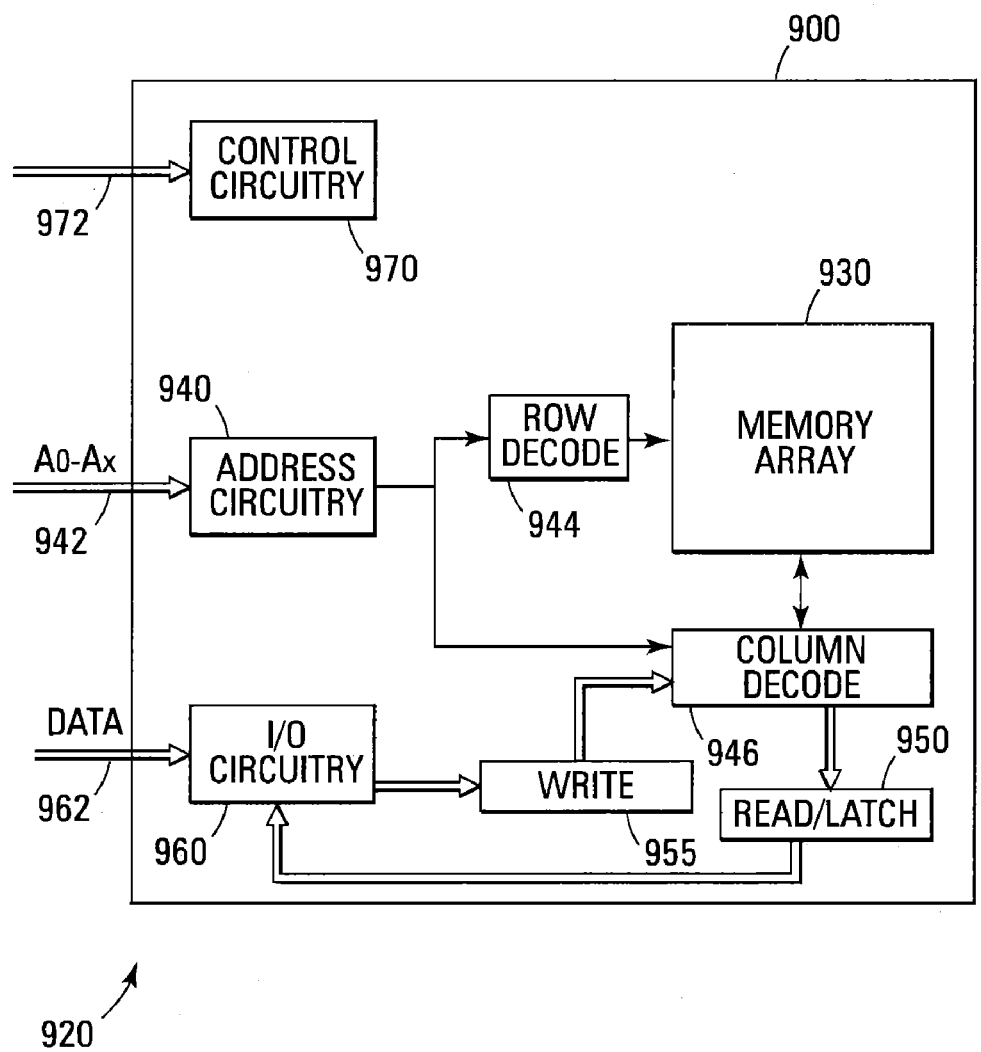
FIG. 9 shows a block diagram of a memory device incorporating the memory cell embodiments of the present invention.

FIG. 9 illustrates a functional block diagram of a memory device 900 of the present invention. The memory device 900 has been simplified to focus on features of the memory that are helpful in understanding the present invention.

The memory device includes an array of memory cells 930 of the present invention as discussed previously. The memory cells can be DRAM type memory cells, non-volatile memory cells or a combination of both. The memory array 930 is arranged in banks of rows and columns along word lines and bit lines, respectively.

An address buffer circuit 940 is provided to latch address signals provided on address input connections A0-Ax 942. Address signals are received and decoded by a row decoder 944 and a column decoder 946 to access the memory array 930. It will be appreciated by those skilled in the art, with the benefit of the present description, that the number of address input connections depends on the density and architecture of the memory array 930. That is, the number of addresses increases with both increased memory cell counts and increased bank and block counts.

The memory device 900 reads data in the memory array 930 by sensing voltage or current changes in the memory array columns using sense/latch circuitry 950. The sense/latch circuitry, in one embodiment, is coupled to read and latch a row of data from the memory array 930. Data input and output buffer circuitry 960 is included for bi-directional data communication over a plurality of data connections 962. Write circuitry 955 is provided to write data to the memory array.

Control circuitry 970 decodes signals provided on control connections 972. These signals are used to control the operations on the memory array 930, including data read, data write, and erase operations. In one embodiment, the control circuitry 970 executes the embodiments of the memory cell row remapping and erasing of the present invention. The control circuitry 970 may be a state machine, a sequencer, or some other type of controller.

The flash memory device illustrated in FIG. 9 has been simplified to facilitate a basic understanding of the features of the memory. A more detailed understanding of internal circuitry and functions of flash memories are known to those skilled in the art.

Figure 10:
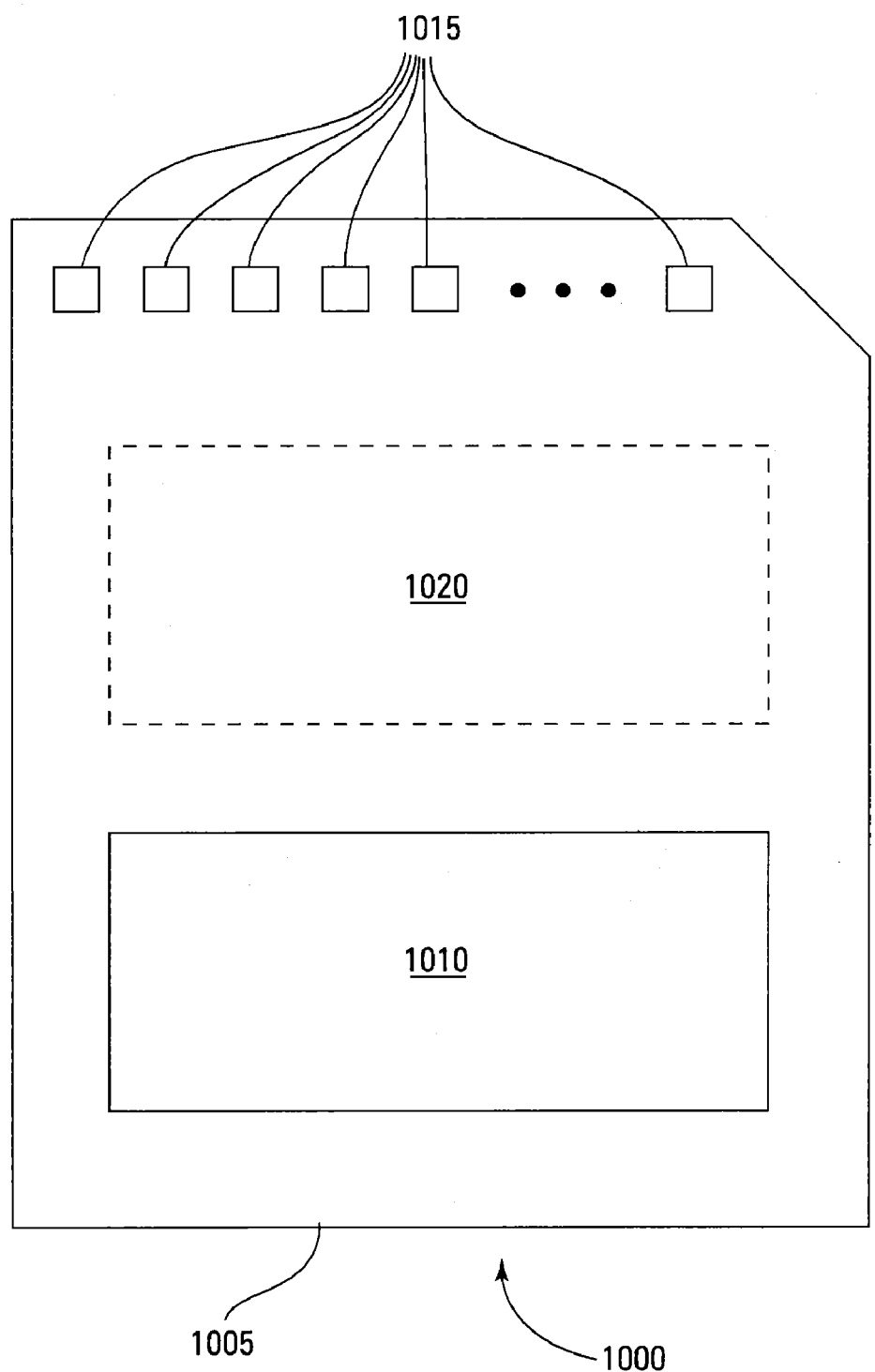
FIG. 10 shows a block diagram of one embodiment of a memory module incorporating the memory cell embodiments of the present invention.

FIG. 10 is an illustration of a memory module 1000 that incorporates the memory cell embodiments as discussed previously. Although memory module 1000 is illustrated as a memory card, the concepts discussed with reference to memory module 1000 are applicable to other types of removable or portable memory, e.g., USB flash drives. In addition, although one example form factor is depicted in FIG. 10, these concepts are applicable to other form factors as well.

Memory module 1000 includes a housing 1005 to enclose one or more memory devices 1010 of the present invention. The housing 1005 includes one or more contacts 1015 for communication with a host device. Examples of host devices include digital cameras, digital recording and playback devices, PDAs, personal computers, memory card readers, interface hubs and the like. For some embodiment, the contacts 1015 are in the form of a standardized interface. For example, with a USB flash drive, the contacts 1015 might be in the form of a USB Type-A male connector. For some embodiments, the contacts 1015 are in the form of a semi-proprietary interface, such as might be found on Compact-Flash™ memory cards licensed by SanDisk Corporation, Memory Stick™ memory cards licensed by Sony Corporation, SD Secure Digital™ memory cards licensed by Toshiba Corporation and the like. In general, however, contacts 1015 provide an interface for passing control, address and/or data signals between the memory module 1000 and a host having compatible receptors for the contacts 1015.

The memory module 1000 may optionally include additional circuitry 1020. For some embodiments, the additional circuitry 1020 may include a memory controller for controlling access across multiple memory devices 1010 and/or for providing a translation layer between an external host and a memory device 1010. For example, there may not be a one-to-one correspondence between the number of contacts 1015 and a number of I/O connections to the one or more memory devices 1010. Thus, a memory controller could selectively couple an I/O connection (not shown in FIG. 10) of a memory device 1010 to receive the appropriate signal at the appropriate I/O connection at the appropriate time or to provide the appropriate signal at the appropriate contact 1015 at the appropriate time. Similarly, the communication protocol between a host and the memory module 1000 may be different than what is required for access of a memory device 1010. A memory controller could then translate the command sequences received from a host into the appropriate command sequences to achieve the desired access to the memory device 1010. Such translation may further include changes in signal voltage levels in addition to command sequences.

The additional circuitry 1020 may further include functionality unrelated to control of a memory device 1010. The additional circuitry 1020 may include circuitry to restrict read or write access to the memory module 1000, such as password protection, biometrics or the like. The additional circuitry 1020 may include circuitry to indicate a status of the memory module 1000. For example, the additional circuitry 1020 may include functionality to determine whether power is being supplied to the memory module 1000 and whether the memory module 1000 is currently being accessed, and to display an indication of its status, such as a solid light while powered and a flashing light while being accessed. The additional circuitry 1020 may further include passive devices, such as decoupling capacitors to help regulate power requirements within the memory module 1000.

Figure 11:
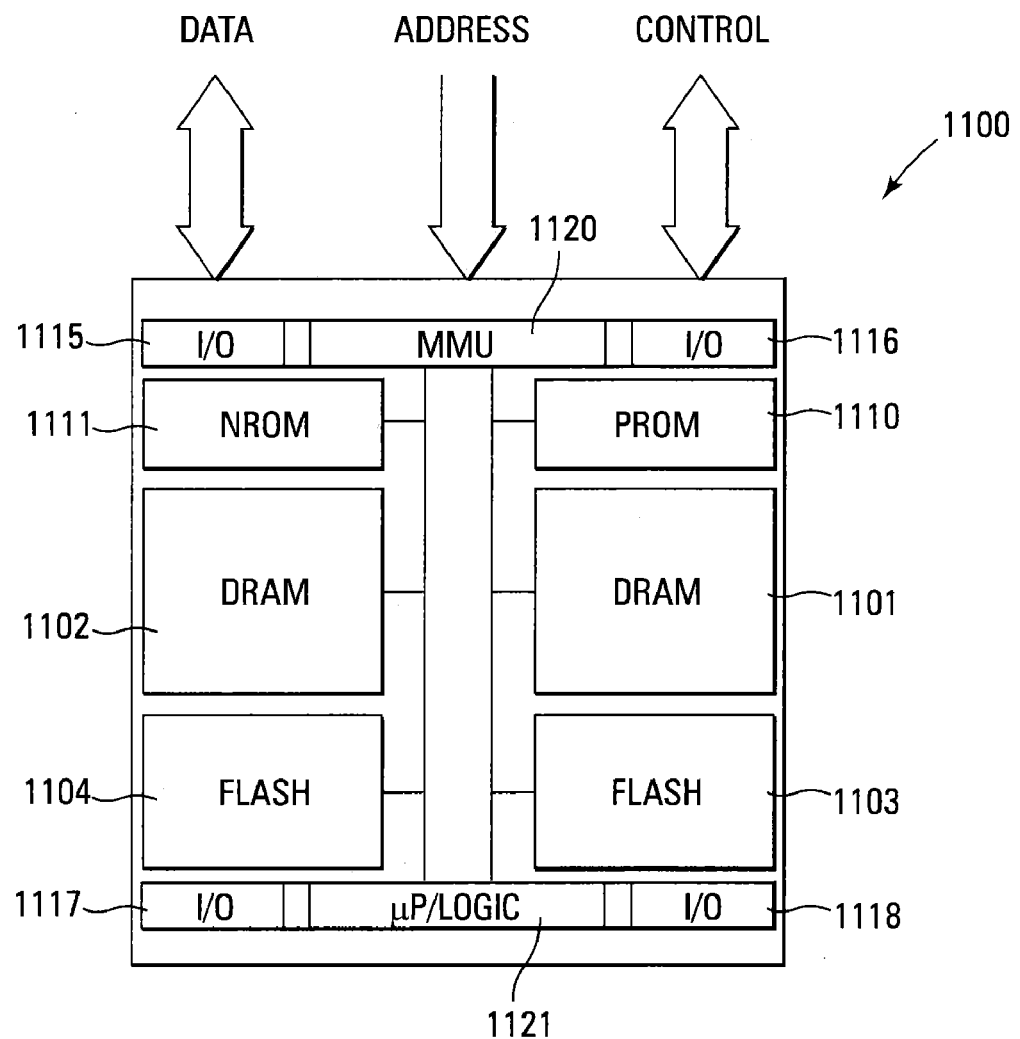
FIG. 11 shows a block diagram of one embodiment of a single chip memory system incorporating the memory cell embodiments of the present invention.

FIG. 11 illustrates a functional block diagram of a single chip controller/memory system device 1100 that can incorporate the non-volatile memory and DRAM cells of the present invention. The fabrication techniques of the above-described structures allow these different memory technologies to be fabricated on a single integrated circuit.

The embodiment of FIG. 11 is for purposes of illustration only. The NROM/PROM/flash/DRAM cells of the present invention can be incorporated in any integrated circuit.

The memory system 1100 comprises two capacitor-less DRAM arrays 1101, 1102, two flash memory arrays 1103, 1104, a PROM array 1110, and an NROM array 1111. Each of these memory arrays is constructed using the memory cells described previously.

The system can further contain various input/output (I/O) ports 1115-1118 that can be coupled to outside signals such as data, address, and control buses. A memory management unit (MMU) 1120 can be used to control access to each of the memory blocks 1101-1104, 1110, 1111 for both external access by another processor or by an internal microprocessor/control logic 1121.

Conclusion

In summary, the multi-functional memory cells of the present invention are fabricated by a process incorporating Ge nano-crystals of uniform distribution, size, and with a high density ($\geqq 10^{13}/cm^2$) into a trapping dielectric and at any desired distance from the charge injecting interface. With the fabrication method of the present invention, the tunnel distance of the device, as well as the nano-crystal size, separation, and density, can be controlled and incorporated in any desired plane from the silicon/insulator interface. Therefore, a large memory window can be achieved both at short tunnel distance (high speed but reduced retention to achieve capacitor-less DRAM functionality) and long tunnel distance (reduced speed but enhanced retention to achieve non-volatile memory functionality).

Additionally, multiple layers of charge trapping planes can be incorporated in appropriate dielectric medium to optimize normal mode/reverse mode device operations with multiple functionality and tailored device characteristics. Multi-level storage states can also be achieved by providing and activating appropriate planes of charge trapping layers.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for fabricating a multi-functional memory cell, the method comprising:
forming a tunnel insulator over a substrate;
ion implanting of helium on the tunnel insulator;
rapid thermal annealing to establish uniform nucleation centers of a predetermined density;
depositing material to generate nano-crystals;
rapid thermal annealing to synthesize nano-crystals over the nucleation centers;
forming a charge blocking layer over the nano-crystals; and
forming a gate electrode over the charge blocking layer.

2. The method of claim 1 wherein forming the tunnel insulator layer comprises forming a first layer comprised of $HfO_2$ and a second layer comprised of $LaAlO_3$.

3. The method of claim 1 and further including incorporating a planar layer of injector silicon rich nitride as a nucleation seed layer prior to depositing the material to generate the nano-crystals.

4. The method of claim 1 wherein the material to generate the nano-crystals is germanium.

5. The method of claim 1 wherein the material to generate the nano-crystals is germanium and silicon.

6. The method of claim 1 and further including depositing a passivation layer over the charge blocking layer.

7. The method of claim 1 wherein depositing the material to generate the nano-crystals comprises depositing the material using one of ion implantation or atomic layer deposition.

8. The method of claim 1 wherein the tunnel insulator is formed to a thickness in a range of 4-9 nm.

9. The method of claim 1 wherein the charge blocking layer is formed to a thickness of 6-20 nm.

10. The method of claim 2 wherein the material to generate the nano-crystals is deposited between the first and second layers of the tunnel insulator for DRAM functionality of the memory cell and between the second layer of the tunnel insulator and the charge blocking layer for non-volatile memory functionality of the memory cell.

11. The method of claim 1 wherein the ion implanting of helium is performed by an ultra-low energy implanter.

12. The method of claim 2 wherein a discrete trapping layer is embedded at the interface of the $HfO_2$ and the $LaAlO_3$ layers.

13. The method of claim 1 wherein the charge blocking layer comprises HfSiON.

14. The method of claim 1 wherein the charge blocking layer comprises HfSiON and layers of the first and a second tunnel insulator that are closest to the HfSiON comprise $LaAlO_3$.

* * * * *

UNITED STATES PATENT AND TRADEMARK OFFICE
CERTIFICATE OF CORRECTION

PATENT NO.           : 8,288,264 B2                                      Page 1 of 1
APPLICATION NO.      : 13/027573
DATED                : October 16, 2012
INVENTOR(S)          : Arup Bhattacharyya It is certified that error appears in the above-identified patent and that said Letters Patent is hereby corrected as shown below:

On the face page, in field (54) and in column 1, line 1, in "Title", delete "MULTI-FUNCTION" and insert -- MULTI-FUNCTIONAL --, therefor.

Signed and Sealed this
First Day of January, 2013

David J. Kappos
*Director of the United States Patent and Trademark Office*